(12) United States Patent
Boyd et al.

(10) Patent No.: US 6,461,529 B1
(45) Date of Patent: Oct. 8, 2002

(54) ANISOTROPIC NITRIDE ETCH PROCESS WITH HIGH SELECTIVITY TO OXIDE AND PHOTORESIST LAYERS IN A DAMASCENE ETCH SCHEME

(75) Inventors: Diane C. Boyd, Lagrangeville, NY (US); Stuart M. Burns, Brookfield, CT (US); Hussein I. Hanafi, Basking Ridge, NJ (US); Waldemar W. Kocon, Wappingers Falls, NY (US); William C. Wille, Red Hook, NY (US); Richard Wise, Beacon, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/299,137

(22) Filed: Apr. 26, 1999

(51) Int. Cl.[7] ............................................ H01L 21/3215
(52) U.S. Cl. ..................... 216/67; 216/72; 252/79.1; 438/723; 438/724; 438/725; 438/743; 438/744
(58) Field of Search .......................... 252/79.1; 216/67, 216/72; 438/723, 724, 725, 738, 743, 744

(56) References Cited

U.S. PATENT DOCUMENTS

| | | | |
|---|---|---|---|
| 4,511,430 A | | 4/1985 | Chen et al. ............... 156/643 |
| 4,560,458 A | * | 12/1985 | Ueno et al. ............... 204/165 |
| 4,774,198 A | | 9/1988 | Contiero et al. ........... 437/30 |
| 4,857,140 A | | 8/1989 | Loewenstein ............. 156/643 |
| 4,910,041 A | * | 3/1990 | Yanagihara et al. ........ 427/37 |
| 4,978,420 A | | 12/1990 | Bach ...................... 156/643 |
| 5,102,817 A | | 4/1992 | Chatterjee et al. ......... 437/47 |
| 5,201,993 A | | 4/1993 | Langley .................. 156/643 |
| 5,201,994 A | | 4/1993 | Nonaka et al. ............ 156/643 |
| 5,286,344 A | | 2/1994 | Blalock et al. ............ 156/657 |
| 5,310,454 A | | 5/1994 | Ohiwa et al. ............. 156/643 |
| 5,421,891 A | * | 6/1995 | Campbell et al. ......... 118/723 R |
| 5,610,099 A | | 3/1997 | Stevens et al. ............ 437/192 |
| 5,814,563 A | * | 9/1998 | Ding et al. ............... 438/714 |
| 5,824,604 A | * | 10/1998 | Bar-Gadda ............... 438/725 |
| 5,843,847 A | * | 12/1998 | Pu et al. .................. 438/723 |
| 6,014,979 A | * | 1/2000 | Van Autryve et al. ...... 134/1.1 |
| 6,015,761 A | * | 1/2000 | Merry et al. .............. 438/727 |
| 6,051,504 A | | 4/2000 | Armacost et al. .......... 438/706 |
| 6,066,566 A | * | 5/2000 | Naeem et al. ............. 438/700 |
| 6,074,959 A | * | 6/2000 | Wang et al. .............. 438/738 |
| 6,211,092 B1 | * | 3/2001 | Tang et al. ............... 438/719 |

OTHER PUBLICATIONS

US 6,156,225, 12/2000, Minor et al. (withdrawn)*
R. Colclaser, Microelectronics Processing & Device Design, 266–270, (John Wiley & Sons 1988).

* cited by examiner

Primary Examiner—Frankie L. Stinson
Assistant Examiner—Allan Olsen
(74) Attorney, Agent, or Firm—Ratner & Prestia; H. Daniel Schnurmann

(57) ABSTRACT

A process and etchant gas composition for anisotropically etching a trench in a silicon nitride layer of a multilayer structure. The etchant gas composition has an etchant gas including a polymerizing agent, a hydrogen source, an oxidant, and a noble gas diluent. The oxidant preferably includes a carbon-containing oxidant component and an oxidant-noble gas component. The fluorocarbon gas is selected from $CF_4$, $C_2F_6$, and $C_3F_8$; the hydrogen source is selected from $CHF_3$, $CH_2F_2$, $CH_3F$, and $H_2$; the oxidant is selected from $CO$, $CO_2$, and $O_2$; and the noble gas diluent is selected from He, Ar, and Ne. The constituents are added in amounts to achieve an etchant gas having a high nitride selectivity to silicon oxide and photoresist. A power source, such as an RF power source, is applied to the structure to control the directionality of the high density plasma formed by exciting the etchant gas. The power source that controls the directionality of the plasma is decoupled from the power source used to excite the etchant gas. The etchant gas can be used during a nitride etch step in a process for making a metal oxide semiconductor field effect transistor.

4 Claims, 9 Drawing Sheets

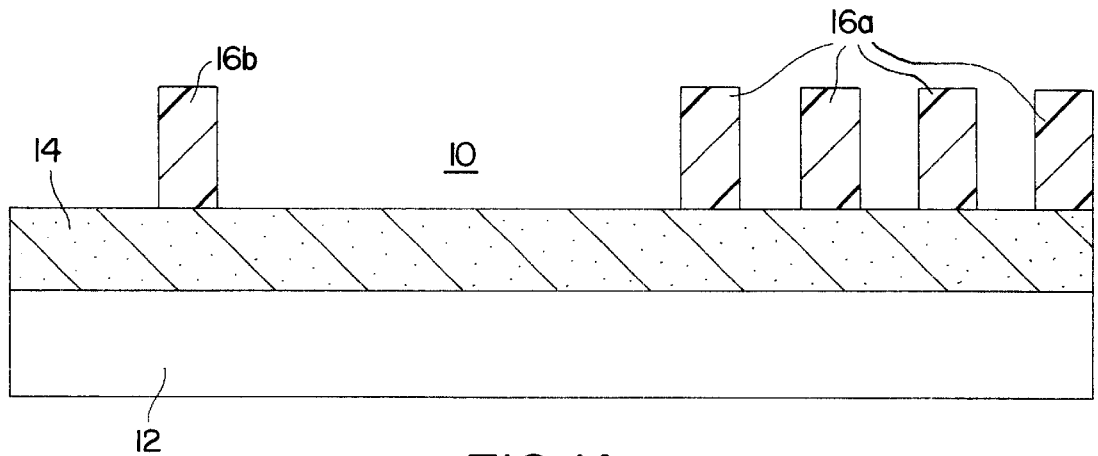
FIG. IA
PRIOR ART
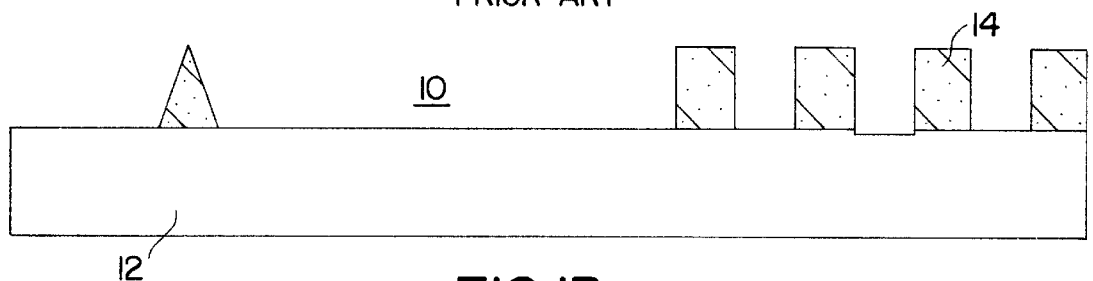
FIG. IB
PRIOR ART
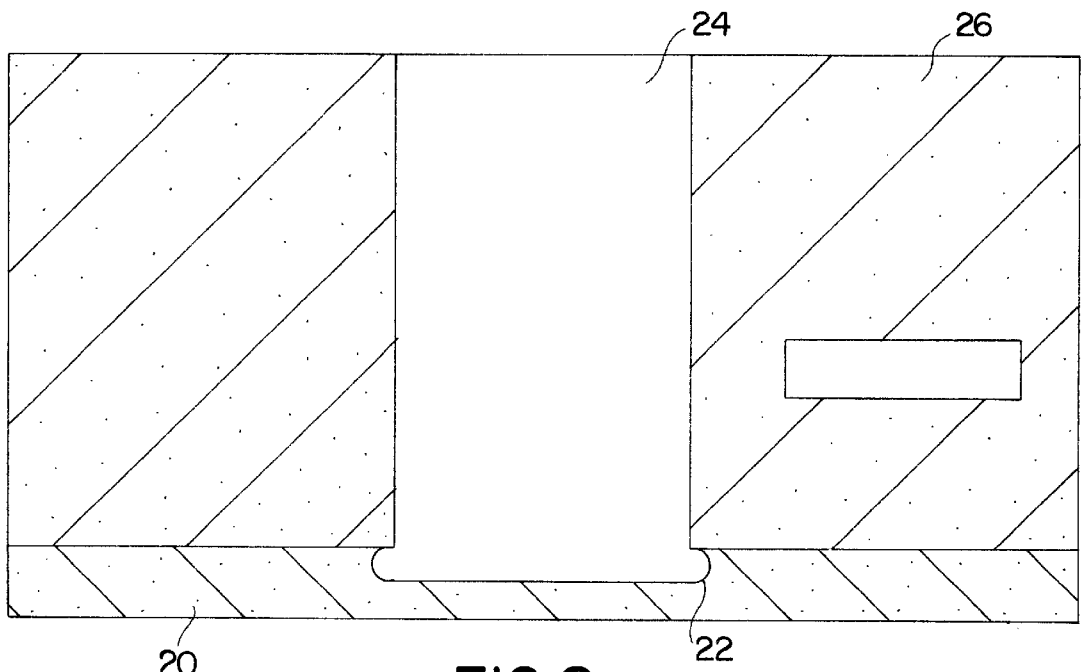
FIG. 2
PRIOR ART

ANISOTROPIC NITRIDE ETCH PROCESS WITH HIGH SELECTIVITY TO OXIDE AND PHOTORESIST LAYERS IN A DAMASCENE ETCH SCHEME

FIELD OF THE INVENTION

The present invention relates to patterning lines in a silicon nitride layer formed on a semiconductor wafer or on another multilayer structure.

BACKGROUND OF THE INVENTION

In semiconductor fabrication, it is often desirable to anisotropically etch thick dielectric films with high aspect ratio features (e.g., 4:1 or greater) without excessive erosion of an accompanying photoresist and with a high selectivity to oxide layers (e.g., silicon oxide). In many applications, the profile of the patterned nitride must be vertical. Current state-of-the-art nitride etch processes do not achieve etch profiles which are sufficiently vertical or etch processes which have sufficient selectivity to oxide.

As an example of such an application, formation of device gates by a damascene etch process requires that a nitride material be etched vertically to a thin thermal oxide material underneath the nitride. The stop layer of thermal oxide material is removed, and an even thinner gate oxide is grown in its place. The thickness of the stop layer is constrained by the ability to remove it without significant undercut, whereas the thickness of the grown gate oxide is determined by the device performance characteristics. A gate conductor is then deposited and polished down to the nitride.

In a standard gate etch process, a hard mask is needed to ensure adequate and controllable selectivity to the thin stop layer of thermal oxide material. Patterning of the hard mask with resist in place is the primary contributor to nested and isolated line variation. More particularly, FIGS. 1A and 1B show a standard (i.e., non-damascene) gate etch process of a multilayer structure 10. Structure 10 includes conductive gate stack 12, silicon nitride hard mask 14, nested lines 16a of a photoresist layer, and an isolated line 16b of the phototesist layer. After the photoresist layer is deposited on top of silicon nitride hard mask layer 14, the hard mask layer is etched to form a pattern in the hard mask layer corresponding to the pattern of the photoresist layer. The photoresist is subsequently stripped, leaving the patterned silicon nitride hard mask layer 14 shown in FIG. 1B. As can be seen from FIG. 1B, the portion of silicon nitride hard mask layer 14 which was under isolated lines 16b is eroded laterally during the mask etch process, and the silicon nitride hard mask layer displays significant across-chip line width variation (ACLV).

The difference in photoresist loading in the local region of the nested and isolated lines is the major contributing factor which causes the nested-to-isolated etch bias. For example, nearly 100% of the area near isolated line 16b is open (i.e., free of photoresist); in contrast, only about 50% of the area near nested lines 16a is open. The plasma chemistry is chosen to be reactive with silicon nitride, and the local concentration of reactive species (e.g., ions, radicals, and polymer precursors) in the etchant gas will be depleted in the vicinity of isolated line 16b due to the relatively high local loading of silicon nitride. The large area of nitride surrounding isolated line 16b acts as a sink for the reactive species.

Similarly, the local presence of more resist near nested lines 16a tends to shift the local plasma chemistry relative to the resist-poor regions near isolated line 16b. Specifically, the erosion of photoresist acts as a source of polymer precursors. Therefore, the region of hard mask layer 14 near isolated line 16b is exposed to a less polymerizing chemistry than that near nested lines 16a, thereby causing the lateral erosion in the etched hard mask under the isolated line as shown in FIG. 1B.

In a standard hard mask gate etch scheme as shown in FIGS. 1A and 1B, silicon is etched selective to thermal oxide (not shown, but formed as a thin layer over gate stack 12), typically in a chloride- or bromide-based etchant gas. Because the gate conductor etch is nonselective to the substrate (i.e., gate stack 12), any breakthrough of the thermal oxide leads to catastrophic attack of the underlying silicon. This risk becomes especially important as the gate oxide thickness is scaled down to increase device speed. As gate line widths are reduced, the aspect ratio of the gate stack increases. Stability of the gate stack in a hard mask gate etch scheme becomes an issue at very aggressive ground rules.

In the gate formation process, it is often necessary to strip a sacrificial thermal oxide layer and then grow a fresh gate oxide, as shown in FIG. 2. The thickness of a sacrificial thermal oxide layer 20 is constrained by the degree of anisotropy of the etch during stripping of the oxide. Any undercut of thermal oxide layer 20 will cause a foot 22 to form after the subsequent polysilicon 24 (gate conductor) fills the gate hole of a silicon nitride layer 26. Foot 22 degrades device performance.

Moreover, in any isotropic etch such as that shown in FIG. 4B, ions 51 are not accelerated toward a silicon nitride layer 50 in a uniform direction. Consequently, etching proceeds in every direction, undercutting a photoresist layer 52 and limiting the packing density of the devices. In FIG. 4B, silicon nitride layer 50 could be formed over a silicon substrate (not shown).

Although the art of etching silicon nitride is well developed, some problems inherent in this technology still exist. One particular problem is etching for high aspect ratio silicon nitride levels, while retaining high selectivity to both photoresist and oxide layers. Therefore, a need exists for a process for patterning silicon nitride with a high aspect ratio while maintaining high selectivity to photoresist and oxide layers and avoiding subsequent loss of image integrity.

SUMMARY OF THE INVENTION

To meet this and other needs, and in view of its purposes, the present invention provides a process for anisotropically etching a trench in a silicon nitride layer of a multilayer structure in a damascene etch scheme. The process comprises the steps of: exciting an etchant gas comprising a polymerizing agent, a hydrogen source, an oxidant, and a noble gas diluent to form a high density plasma, in which the etchant gas has high nitride selectivity to a silicon oxide layer (formed over a substrate and below the nitride layer) and to a photoresist layer (formed over the nitride layer); and introducing the high density plasma to etch the exposed portion of the silicon nitride layer to form the trench extending to the silicon oxide layer.

In the present invention, the polymerizing agent is selected from the group consisting of at least one of $CF_4$, $C_2F_6$, and $C_3F_8$; the hydrogen source is selected from the group consisting of at least one of $CHF_3$, $CH_2F_2$, $CH_3F$, and $H_2$; the oxidant is selected from the group consisting of at least one of CO, $CO_2$, and $O_2$; and the noble gas diluent is selected from the group consisting of at least one of He, Ar, and Ne. In a preferred embodiment of the present invention, the oxidant comprises a carbon-containing oxidant component, such as $CO_2$, and an oxidant-noble gas component, such as $O_2$ in He. The concentrations of the constituents are selected to achieve an etchant gas having a high nitride selectivity to photoresist, such as at least about 3:1 and preferably at least about 4:1, and a high nitride selectivity to oxide, such as at least about 4:1 and preferably at least about 5:1.

According to another embodiment of the present invention, the power source used to control the directionality of the plasma, such as a radio frequency (RF) power source, is decoupled from the power source used to excite the etchant gas, such as a coil. Preferably, an RF power source is applied to the side of the structure opposite the side having the silicon nitride layer being etched.

The present invention is also directed to a process for making a metal oxide semiconductor field effect transistor (MOSFET) comprising the steps of: forming a silicon oxide layer over a substrate having at least two shallow trench isolation regions; forming a silicon nitride layer over the oxide layer; depositing a photoresist over the nitride layer so that the photoresist defines a window at which the nitride layer is exposed; exciting an etchant gas having constituents as described above to form a high density plasma; introducing the high density plasma to etch the exposed portions of the nitride layer to the oxide layer in a damascene etch process, thereby leaving a gate hole in the nitride layer at the window; depositing a gate conductor in the gate hole and removing at least a part of the silicon nitride layer wherein the gate conductor forms a gate pillar.

The present invention is also directed to an etchant gas composition used to etch a trench in a silicon nitride layer of a multilayer structure, in a damascene etch scheme. The etchant gas composition comprises a polymerizing agent, a hydrogen source, an oxidant, and a noble gas diluent, as discussed above, and has high nitride selectivity to a silicon oxide layer and to a photoresist layer.

It is to be understood that both the foregoing general description and the following detailed description are exemplary, but are not restrictive, of the invention.

BRIEF DESCRIPTION OF THE DRAWING

The invention is best understood from the following detailed description when read in connection with the accompanying drawing. It is emphasized that, according to common practice, the various features of the drawing are not to scale. On the contrary, the dimensions of the various features are arbitrarily expanded or reduced for clarity. Included in the drawing are the following figures:

FIG. 1A shows the profile of a multilayer structure to be etched by a standard gate etch process;

FIG. 1B shows the profile of the multilayer structure of FIG. 1A after a conventional nitride etch process and a conventional photoresist strip process;

FIG. 2 shows the profile of a multilayer structure having an undesirable undercut of an oxide layer as a result of a conventional isotropic etch;

DETAILED DESCRIPTION OF THE INVENTION

The present invention provides a nitride etch process and composition that have increased selectivity to photoresist and oxide and that provide tunable anisotropy, in a damascene etch scheme. A dry etch process is described which enables a more efficient nitride etch. The preferential etchant gas is a mixture of $C_2F_6$, $CH_3F$, $CO_2$, He, $O_2$, and Ar. The present invention allows for anisotropic etching of silicon nitride, stopping on a thin layer of silicon dioxide, as is required in the formation of gate conductors. The formation of gate conductors (or "gates") is desirable in semiconductor devices such as dynamic random access memories (DRAMs) and logic devices.

Figure 3A:
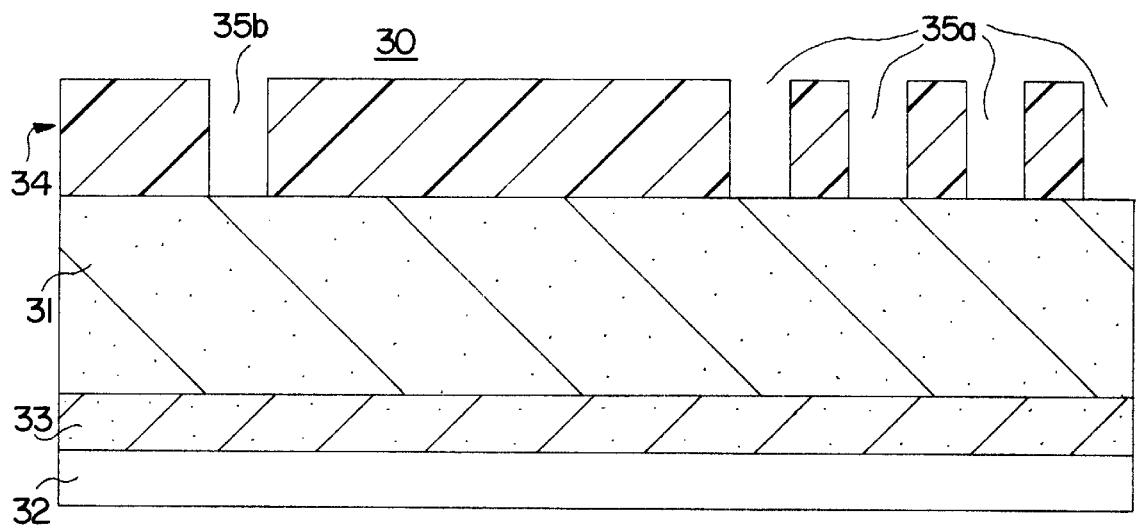
FIG. 3A shows the profile of a multilayer structure prepared for a damascene gate etch process according to the present invention.
Figure 3B:
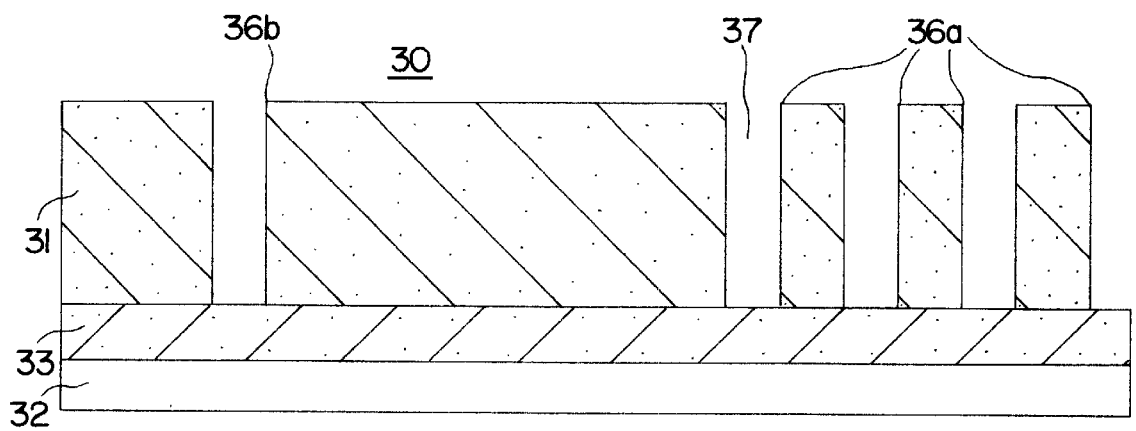
FIG. 3B shows the profile of the multilayer structure of FIG. 3A after a nitride etch process according to the present invention.

FIGS. 3A and 3B show a damascene gate etch process which forms trenches (or patterns) in a silicon nitride layer 31 of a multilayer structure 30. Multilayer structure 30 also includes a semiconductor substrate 32, a thin oxide layer 33, and a photoresist layer 34 which forms nested lines 35a and an isolated line 35b. In a damascene gate etch process, contrasted with a standard gate etch process as shown in FIGS. 1A and 1B, photoresist layer 34 is used to pattern lines or trenches in silicon nitride layer 31 with the majority of the nitride layer remaining on the structure after etching. The resist is then stripped and the trenches 36a and 36b formed in silicon nitride layer 31 are filled with a gate conductor 37.

As shown in FIGS. 3A and 3B, a damascene gate formation process requires near 100% loading of resist near isolated line 35b and a 50% loading of resist near nested lines 35a. By tailoring the etch chemistry for a high nitride selectivity to photoresist, the local variation in the resist loading becomes less important than in the standard etch process, because the etch process must by design be reactive to nitride. In other words, the process can be designed to be insensitive to a variation of 100% to 50% local loading of photoresist, but cannot be designed insensitive to a variation of 100% to 50% local loading of silicon nitride (as shown in FIG. 1A), because the etch is designed to react with nitride. More specifically, during the etch of silicon nitride hard mask 14 around isolated line 16b of the photoresist, the etchant gas reacts with the nitride residing under the isolated line as shown in FIG. 1B; in a damascene gate etch process, there is not such a high degree of silicon nitride exposed near any line.

The constituents of the etchant gas of the present invention are important to develop a gas which has high nitride selectivities to a silicon oxide layer and to a photoresist layer. "Nitride selectivity" to oxide and to photoresist means the ratio of the etch rates of nitride to oxide and nitride to photoresist, respectively. The etchant gas of the present invention includes a polymerizing agent, a hydrogen source, an oxidant, and a noble gas diluent. Preferably, these constituents are combined in such a way to achieve a nitride selectivity to oxide of at least about 4:1 and to photoresist of at least about 3:1. More preferably, the nitride selectivity to oxide is at least about 5:1 and to photoresist is at least about 4:1.

The polymerizing agent of the etchant gas of the present invention is a precursor species that results in the formation of a passivation layer. The polymerizing agent is preferably a fluorocarbon selected from the group consisting of at least one of $CF_4$, $C_2F_6$, and $C_3F_8$. The fluorine aids in the reaction of nitride in the silicon nitride layer, but not with silicon in the silicon oxide (or silicon dioxide) layer. The polymerizing agent decreases undercut and controls taper of the nitride because of its role as a down-hole supplier of $CF_x$ polymer precursors. In particular, a decrease in the amount of polymerizing agent makes the profile more vertical. Also, an increase in the amount of polymerizing agent improves the nitride selectivity to oxide.

The hydrogen source of the etchant gas of the present invention enhances chemical etching of nitride (suggested by increasing isotropy) and improves selectivity to photoresist (by both polymerization and fluorine scavenging). The hydrogen source is preferably selected from the group consisting of at least one of $CHF_3$, $CH_2F_2$, $CH_3F$, and $H_2$. Hydrogen should be avoided in some environments for safety reasons because it is flammable. By increasing the amount of hydrogen source, the nitride selectivity to photoresist improves.

The present invention also uses an oxidant to aid in the removal of the dielectric layer by ion enhanced etching in the vertical direction. The oxidant is an oxygen-containing compound of at least one of $CO$, $CO_2$, and $O_2$. The addition of the oxidant reduces selectivity to photoresist, because the photoresist does not suffer from micro-loading as does silicon nitride. By increasing the polymer content to preserve resist, etch stop occurs more readily in a high aspect ratio feature. An oxidant is a compound that will readily react with a polymerizing agent to form a product (such as a $COF_x$ compound) which is more volatile than the original fluorocarbon. The oxidant addition assists in removal of the passivation layer and switches the gas phase plasma chemistry C/F ratio to lower values, thereby further enhancing etch rate and decreasing passivation polymer formation. An increase in the amount of oxidant increases selectivity to oxide. Preferably, the oxidant comprises a carbon-containing oxidant component, such as $CO_2$, and a oxidant-noble gas component, such as $O_2$ in He.

The final constituent of the etchant gas is a noble gas diluent, preferably selected from the group consisting of at least one of He, Ar, and Ne. Without the noble gas, the etchant gas of the present invention does not have high selectivity to oxide. Thus, the amount of noble gas should be increased if the selectivity to oxide is not high enough.

Exemplary embodiments within the scope of the present invention include gas mixtures of 1%–10% by volume polymerizing agent; 5%–30% by volume hydrogen source; 1%–25% by volume carbon-containing component; 0.1%–20% by volume oxidant-noble gas component (i.e., oxidant in a relative concentration of about 30% in a noble gas); and 0.1–50% by volume of noble gas. Preferably, the etchant gas includes 3%–8% by volume polymerizing agent; 10%–30% by volume hydrogen source; 5%–15% by volume carbon-containing component; 5%–15% by volume oxidant-noble gas component (i.e., oxidant in a relative concentration of about 30% in a noble gas); and 10%–50% by volume of noble gas. Even more preferably, the polymerizing agent is $C_2F_6$; the hydrogen source is $CH_3F$; the carbon-containing component is $CO_2$; the oxidant-noble gas component is $O_2$ in He; and the noble gas diluent is Ar.

The particular concentrations of the constituents can achieve the purposes of the present invention can be adjusted depending on the needs of the particular application, based on the functions of each constituent as discussed above. For example, if the etchant gas shows insufficient nitride selectivity to oxide, then the concentration of the oxidant should be increased, the concentration of the polymerizing agent should be increased, or a combination of both. In addition, the presence of the noble gas diluent contributes to selectivity to oxide.

Further, if the etchant gas shows insufficient nitride selectivity to photoresist, then the concentration of the hydrogen source should be increased. If, after increasing the concentration of the hydrogen source, an adequate nitride selectivity to photoresist still cannot be achieved, then the particular compounds of the polymerizing agent and the hydrogen source should be selected in a way which increases the H:F ratio of the etchant gas. A reduction in both the hydrogen and the oxidant from the above conditions yields similar profiles because the loss of the hydrogen source (e.g., $CH_3F$) is balanced by reduction of the oxidizer (e.g., CO).

The taper angle can also be controlled by varying the relative concentrations of the etchant gas. For example, an increase in the dose of polymerizing agent (e.g., $C_2F_6$), with the other constituents constant, increases the degree of taper of a trench in a nitride layer. The ability to carefully control taper angle in a high aspect ratio nitride feature enables easier fill of the hole during later processing.

According to the present invention, the etchant gas is excited to form a high density plasma. The power source used to control the directionality of the plasma is decoupled from the power source used to excite the etchant gas to form the high density plasma. Thus, a decoupled power source incorporates independent control of bias on the wafer from the plasma generation mechanism. The term "decoupled" is used because the ion bombardment energy is primarily controlled by the bias to the wafer, whereas the ion flux (and plasma density) is primarily controlled by the power applied to the generating structure (e.g., coils in an inductive plasma source).

Figure 4A:
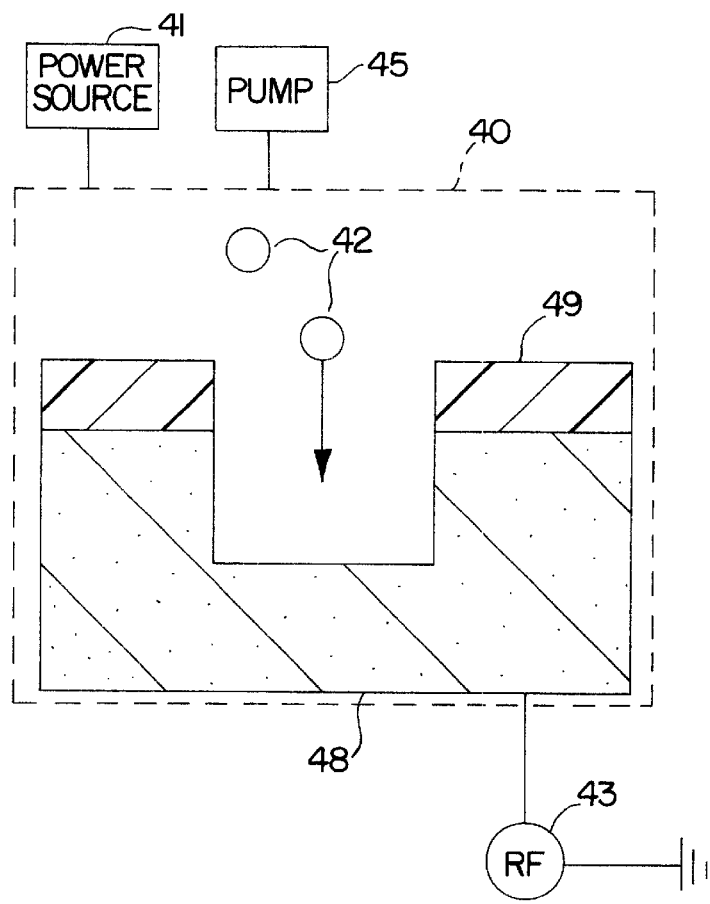
FIG. 4A shows the profile of a nitride layer etched using a biased substrate according to the present invention.
Figure 4B:
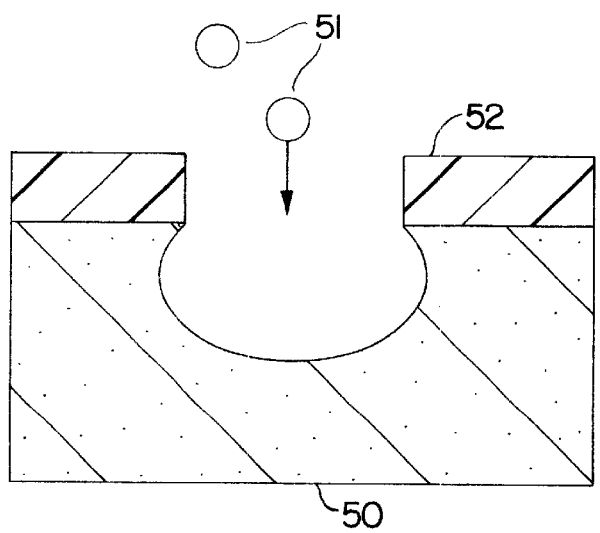
FIG. 4B shows the profile of a nitride layer etched using a conventional process with an unbiased substrate.

This structure is shown in FIG. 4A, in which the etchant gas is introduced to a chamber 40 (shown in dashed lines), and the etchant gas is excited by a first power source 41 to form a high density plasma having ions 42. A second power source, such as RF power source 43, is decoupled from first power source 41. Preferably, the pressure of chamber 40 is maintained at about 2 to 40 millitorrs by using a vacuum pump 45 which is coupled to chamber 40.

A biased substrate, such as that used by the decoupled plasma source, oscillates the potential of the wafer platen, typically by several thousand volts. Although a certain fraction of this potential is shielded by the plasma electrons (sheath capacitance) and wafer-chuck capacitance, the acceleration of the ions striking the wafer is much larger, typically an acceleration corresponding to 50 to 500 V. This additional energy accelerates etching in a direction normal to the wafer surface, and is responsible for the anisotropic etching in the present invention.

In a biased substrate, as shown in FIG. 4A, RF power source 43 is applied to the back of a substrate 48, namely the side of the substrate opposite the layer being etched (such as a silicon nitride layer). In FIG. 4A, substrate 48 could represent a silicon nitride layer formed over a silicon substrate (not shown). RF power source 43 accelerates ions 42 toward the substrate, thereby increasing the etch rate in that direction. The pattern on photoresist 49 is transferred directly to the underlying layers, thus maximizing packing density.

A high density plasma refers to the charged particle density in the plasma. In a conventional or typical density plasma, the ion density is typically less than about $10^{11}$ $cm^{-3}$, whereas in a high density source the fractional ionization is above $10^{11}$ $cm^{-3}$. High density plasma sources accelerate the plasma electrons in a direction normal to reactor boundaries, so that the electron mean free path is long compared to the plasma dimensions. This long mean free path permits a lower operating pressure, but also requires a higher degree of ionization to sustain the plasma with the higher ion wall flux.

The process of the present invention was demonstrated on an Applied Materials High Density Plasma dry etch chamber, although other high density sources (e.g., Lam 9100) can be used. It is within the scope of the invention that any similar chamber containing a gas mixture of the present invention will produce the desired results. The pressure of the chamber is preferably in the range between about 2 and 40 millitorrs.

The etching of a nitride layer described above can be incorporated in a process for making a metal oxide semiconductor field effect transistor (MOSFET) as illustrated in FIGS. 5A–5L. The process steps do not necessarily have to be executed in the order illustrated and described. The fabrication scheme, according to the present invention, is particularly well suited for the formation of MOSFETs with very thin gate oxides (e.g., <5 nm).

Figure 5A:
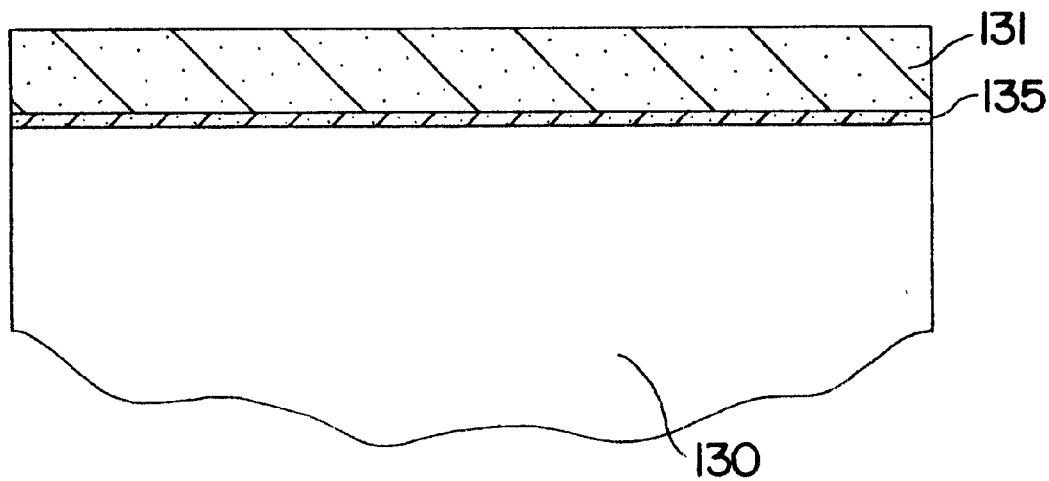
FIGS. 5A through 5L show profiles of a multilayer structure at different stages during the manufacture of a metal oxide semiconductor field effect transistor.

In the example described below, the formation of a MOSFET begins with a substrate 130, which can be any known semiconductor substrate such as a silicon substrate. Substrate 130 is covered by a pad oxide layer 135 and a silicon nitride layer 131, as shown in FIG. 5A. The pad oxide layer 135 is typically between 5 nm and 20 nm thick. An 8 nm thick SiO$_2$ layer may be used as pad oxide layer 135. The oxide layer 135 may be made by rapid thermal processing (RTP) or furnace processing. The silicon nitride layer 131 may consist of Si$_3$N$_4$ and may have a thickness of about 90 nm. The silicon nitride layer 131 can be made using a high temperature, low pressure chemical vapor deposition (LPCVD) process. Other deposition processes can be used, including plasma enhanced chemical vapor deposition (PECVD). Alternatively, the silicon nitride layer can be sputtered.

Figure 5B:
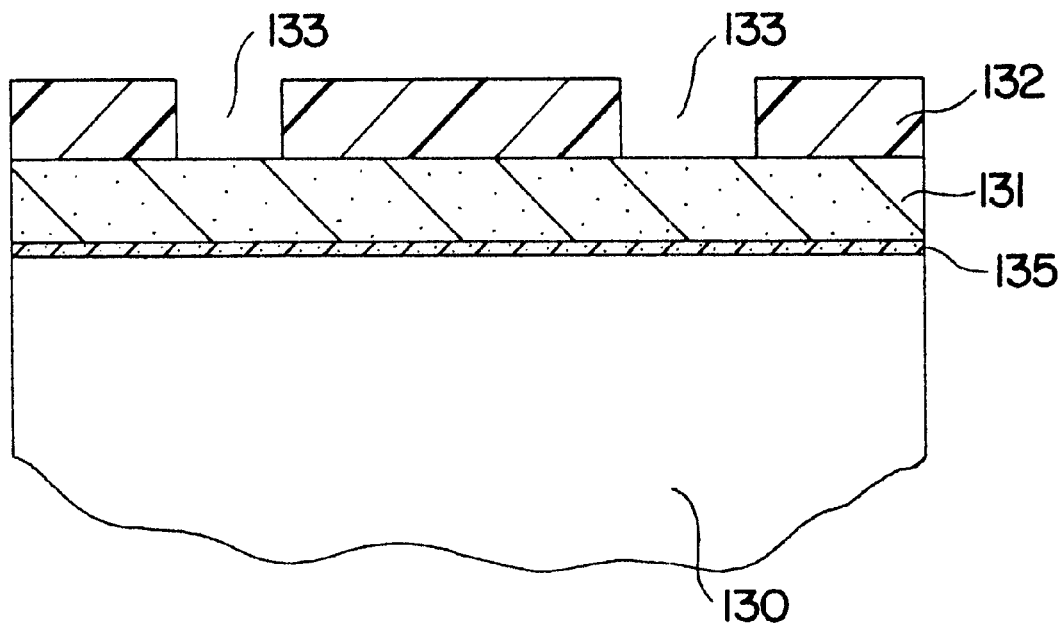

Next, a single-layer photoresist 132 is spun onto silicon nitride layer 131. By conventional lithography, photoresist layer 132 is then patterned to define etch windows 133 for a subsequent etch step, as shown in FIG. 5B. Etch windows 133 expose portions of silicon nitride layer 131 for a subsequent damascene etch. In a damascene etch process, most of the silicon nitride layer is covered by a photoresist layer; in a standard etch process, only selected lines of photoresist are used to cover corresponding lines of nitride. Instead of using a single-layer photoresist, a multi-layer resist, or any other mask including a hard-baked mask, can be used. The shape and size of the etch windows 133 define the lateral dimensions of the shallow trench isolation (STI) trenches to be etched next. Such STI trenches (also known as field oxide isolation trenches) are typically used in MOS technology to provide for isolation between adjacent transistors. Local oxidation of silicon (LOCOS) or poly-buffered LOCOS can be used instead of STIs.

Figure 5C:
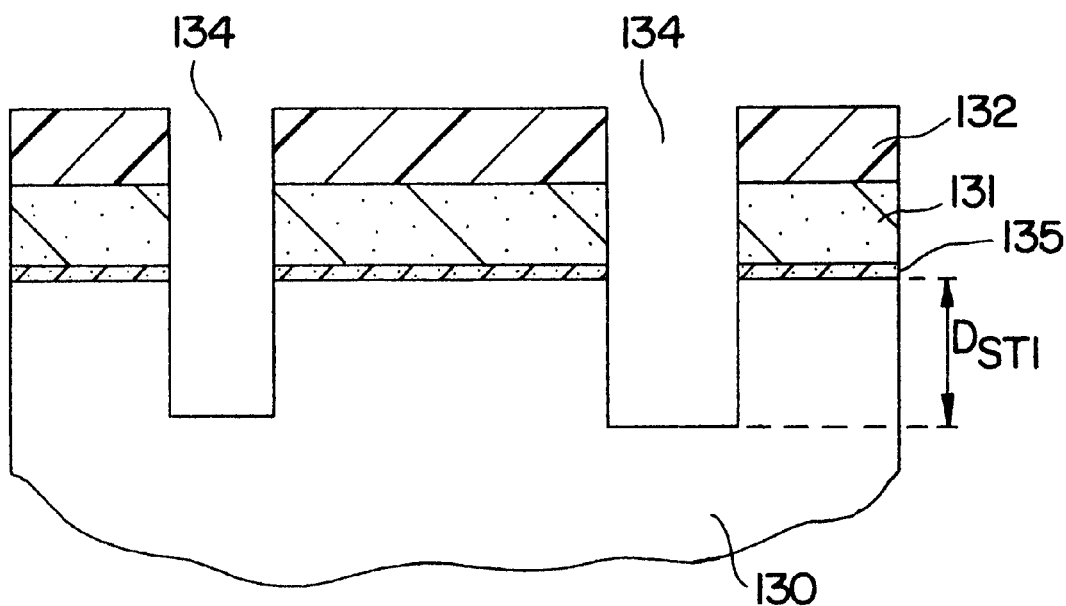
Figure 5D:
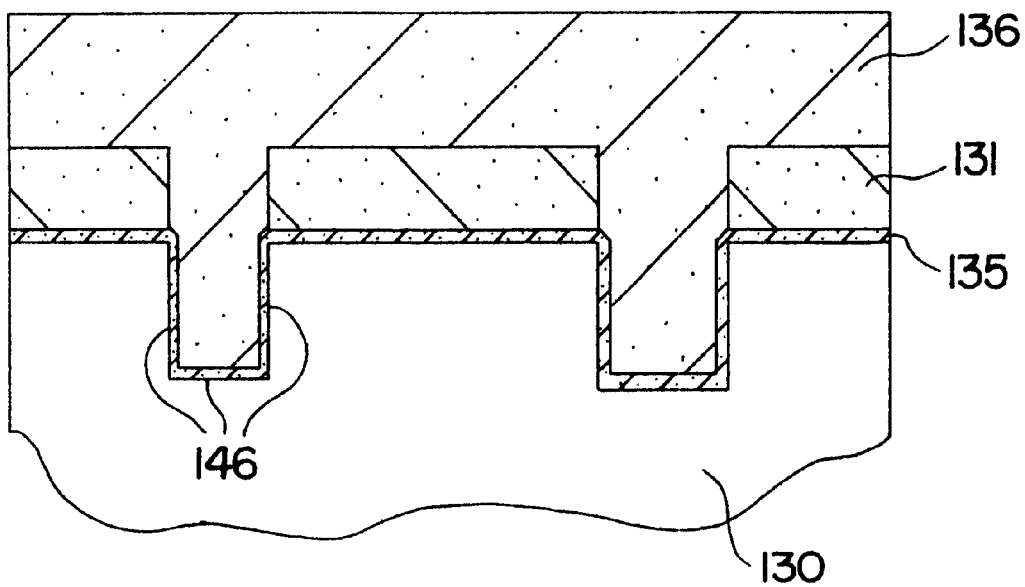

As shown in FIG. 5C, the resist pattern is now transferred into the layered structure underneath by an appropriate etch technique. This step is non-critical. The depth D$_{STI}$ of the STI trenches 134 may be 100 nm or more. Before filling the STI trenches 134 with a suitable isolator, a thin oxide layer 146 may be thermally grown inside the trenches 134, as shown in FIG. 5D. This growth is recommended in particular if the trenches 134 are to be filled by tetra ethyl ortho silicate (TEOS), which is a deposited oxide. Deposited TEOS usually has irregular surface states at the interface with silicon substrate 130. In the absence of oxide layer 146, such irregular surface states could adversely affect the operation of silicon substrate 130.

In the present example, photoresist 132 is removed, a thin thermal oxide layer 146 is formed, and then TEOS 136 is deposited such that all STI trenches 134 are filled down to the bottom, as shown in FIG. 5D. TEOS 136 can be deposited using a LPCVD process. Many other materials can be used instead of TEOS, as long as a sufficient isolation of adjacent transistors (which are not shown in FIGS. 5A–5L) is guaranteed. An advantage of TEOS is that it provides a good stopping layer for any subsequent chemical mechanic polish (CMP) planarization step.

Figure 5E:
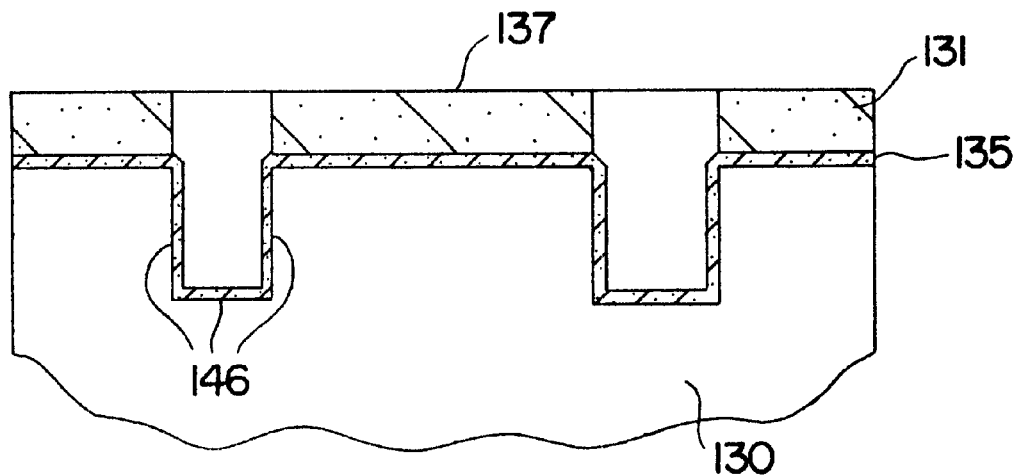
Figure 5F:
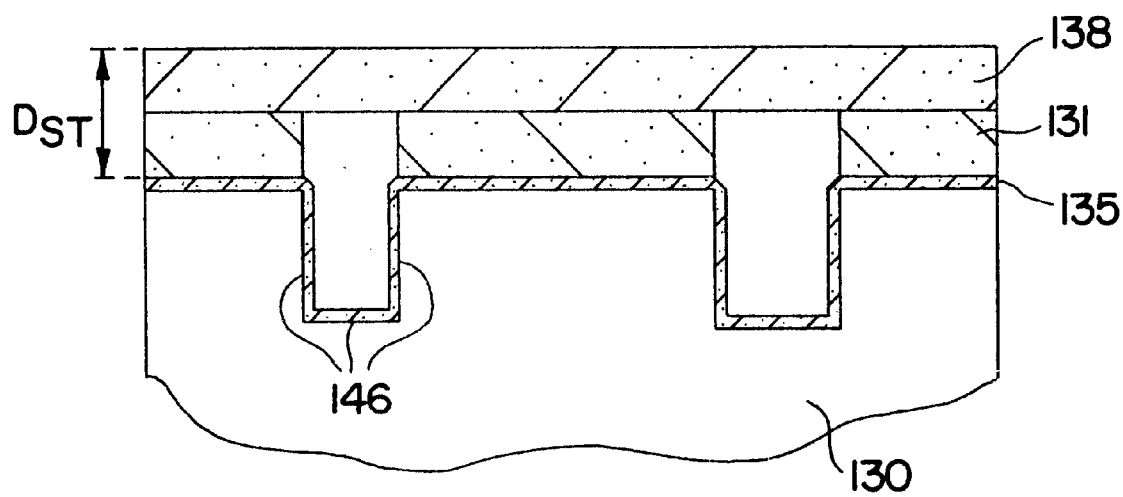

As schematically illustrated in FIG. 5E, the upper surface of the structure is next planarized using a CMP step. In the present embodiment, the CMP step removes the excess TEOS 136 and stops on the silicon nitride layer 131. The upper surface 137 of layer 131 is now completely flat. After CMP, the thickness of this silicon nitride layer 131 is slightly reduced to about 75 nm.

In a subsequent step (see FIG. 5F), the dielectric stack (D$_{ST}$) on top of the pad oxide layer 135 is completed by forming additional layers on top of the planarized surface 137. In the present example, the dielectric stack comprises:

A Si$_3$N$_4$ layer 131 (reduced to about 75 nm thickness); and

A Si$_3$N$_4$ layer 138 (about 50 nm thick).

In the present embodiment, the dielectric stack is formed on top of a semiconductor structure which already comprises certain layers and structural elements, such as STI or LOCOS trenches. Nonetheless, the dielectric stack can be formed on any kind of semiconductor structure, including a simple substrate, a preprocessed substrate, a semiconductor device comprising other circuits, and so forth. The stack may also include additional silicon nitride layers.

In a subsequent step (not shown, resulting in FIG. 5G), a photo-lithographic process is used to define the lateral size (i.e., the gate length, L$_{GATE}$, and gate width, W$_{GATE}$) and the shape of the gate pillars to be formed. The expression "gate pillar" is used in the present application to describe gate structures protruding from the semiconductor structure. The pillar can have any shape and size, as long as the side walls are vertical (i.e., perpendicular with respect to the semiconductor structure). It should be noted, however, that gate pillars having too high an aspect ratio tend to fall over after formation.

Figure 5G:
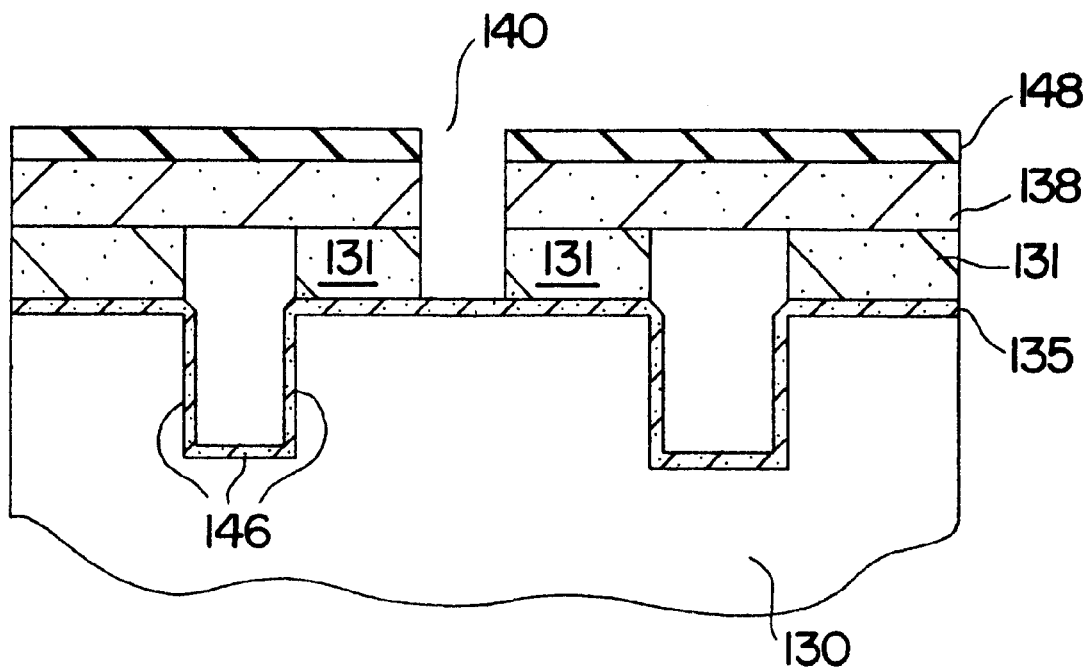

This step is not illustrated because there are many different ways to define the lateral size and shape of the gate pillars. Basically, as shown in FIG. 5G, an etch window 140 is provided in a resist mask 148. The size and shape of etch window 140 is about the same as the lateral size and shape of the gate pillar to be formed. The length of etch window 140 defines the length of the gate hole 150 which in turn ultimately defines the gate length. This gate length then determines the effective channel length.

In order to form the gate hole 150, a gate formation reactive ion etch (RIE) process is used to transfer the etch window 140 provided in the resist mask 148 into the dielectric stack. The gate formation RIE process is that described above in connection with FIGS. 3A and 3B. As discussed above, the RIE process can be optimized to ensure proper etching of the various silicon nitride layers of the dielectric stack.

In the present example, the gate formation RIE process is designed to etch the nitride layers 138 and 131 of the dielectric stack and to stop on the pad oxide layer 135, as illustrated in FIG. 5G. It is important that the selectivity to pad oxide is 4:1 or better, because otherwise the pad oxide 135 may be strongly attacked and its thickness reduced. The depth $D_{GATE}$ of the gate hole 150 (which is about the same as the thickness of the dielectric stack $D_{STACK}$ in FIG. 5F) defines the height of the gate pillar including gate oxide, both yet to be formed. The pillar serving as the gate typically is between 100 nm and 200 nm high. Future MOSFETs will have a gate length of 50 nm and even less. Such short gates can be easily made using the inventive process. The width (out of the paper plane) of conventional gate electrodes is between 2 μm and 50 μm.

Figure 5H:
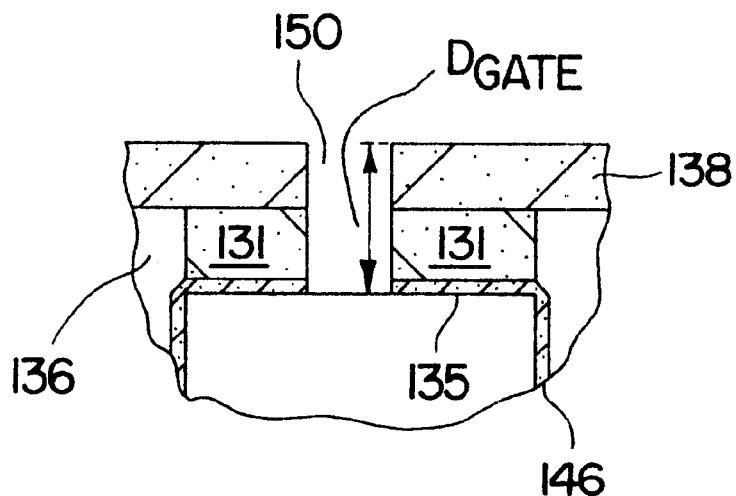
Figure 5I:
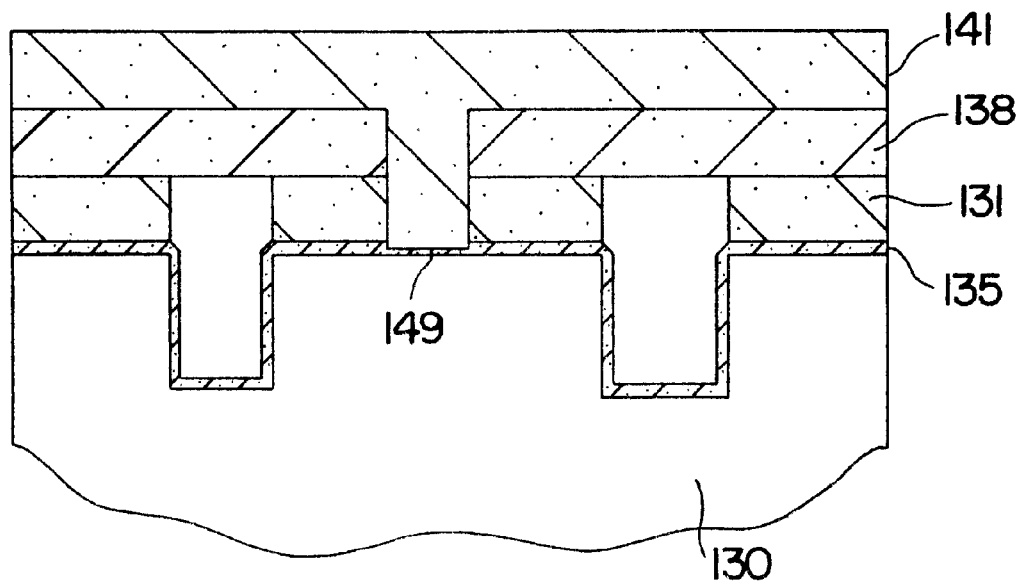

After having defined the gate hole 150 in the dielectric stack, the remainder of pad oxide 135 may be removed from the bottom of the gate hole. This can be done using a hydrofluoric acid (HF) dip. HF is well suited because if attacks oxide layer 135, but does not attack silicon substrate 130. Before the removal of pad oxide layer 135 at the bottom of gate hole 150, the resist 148 is removed. After pad oxide layer 135 is completely removed, as shown in FIG. 5H, a precisely defined gate oxide 149 may be formed as shown in FIG. 5I. The thickness and quality of this gate oxide 149 are independent of the thickness and quality of the pad oxide layer 135. The gate oxide 149 may also be thicker than the pad oxide layer 135, if so desired.

Before the formation of gate oxide 149, a sacrificial oxide layer (not shown) may be formed at the bottom of gate hole 150. This sacrificial oxide layer is then etched away and the structure is heated. This short sequence of steps heals possible damage (caused by the gate formation RIE) of silicon substrate 130 at the bottom of gate hole 150.

As illustrated in FIG. 5I, gate conductor material 141 is deposited in gate hole 150 and within uppermost silicon nitride layer 138 of the dielectric stack. It is important to ensure that gate conductor material 141 completely fills the gate hole 150. The gate conductor material 141 may be polysilicon, deposited by LPCVD (e.g., at about 650° C.). Instead of polysilicon, amorphous silicon can be used and transformed into polysilicon at a later point in time. In fact, any material which is suitable as a gate conductor may be "filled" into the gate hole 150. The present invention is not limited to polysilicon gates.

The polysilicon may or may not be doped. Dopants can be introduced into the polysilicon either during the polysilicon deposition or afterward. It is an advantage of the inventive process that the polysilicon gate does not necessarily have to be doped when the source and drain regions are implanted. The polysilicon gate may be silicided, in one of the subsequent fabrication steps, and a cap dielectric may be deposited to protect the gate during subsequent processing, if deemed appropriate.

Figure 5J:
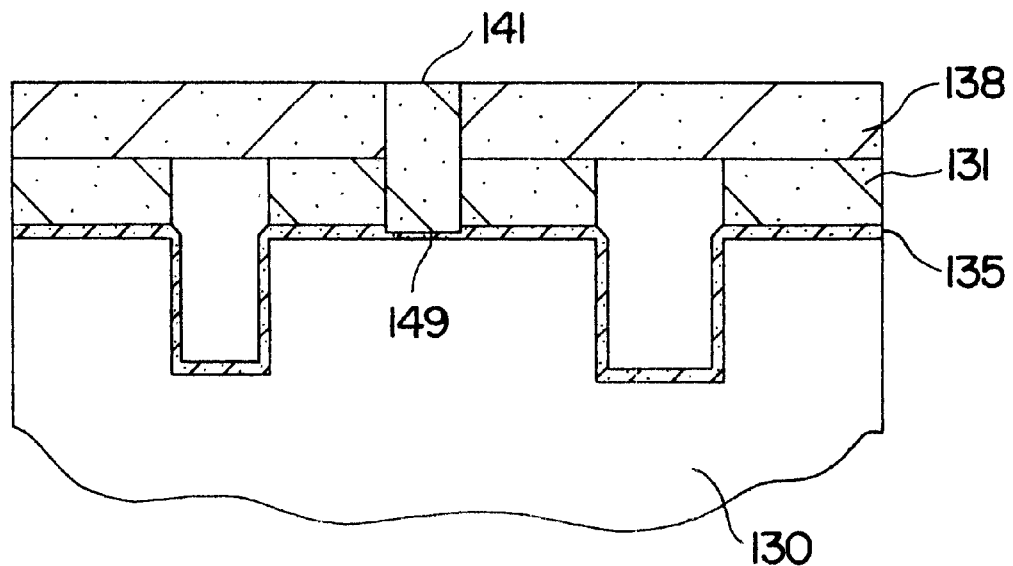

After deposition of the gate conductor material 141, a planarization step may be conducted. Well suited is a CMP process. After planarization, the uppermost silicon nitride layer 138 of the dielectric stack is exposed, as illustrated in FIG. 5J.

Figure 5K:
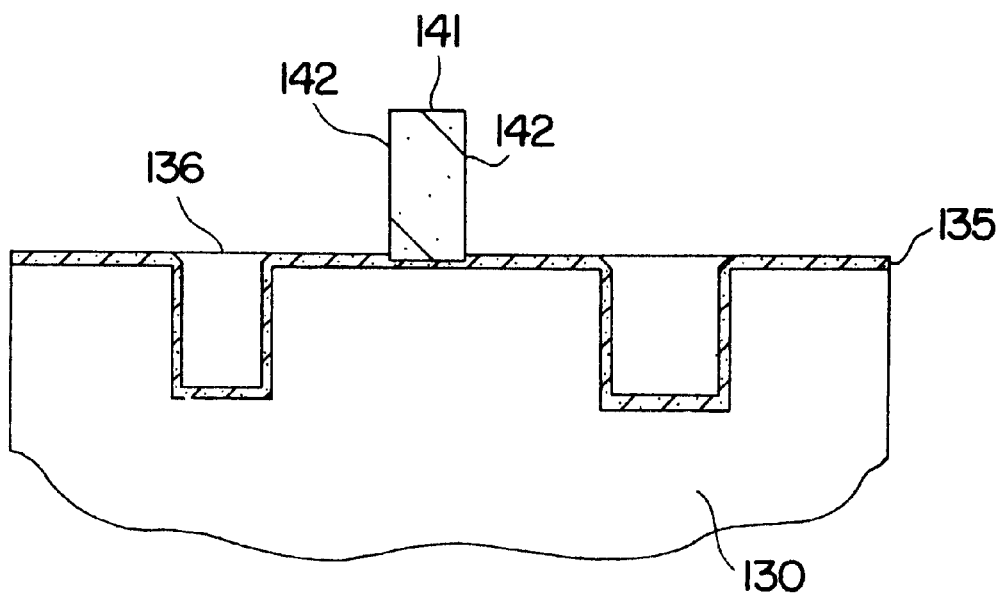

Then, the dielectric stack must be removed. The silicon nitride layers 138 and 131 are stripped using hot phosphoric acid. After complete removal of the dielectric stack, a protruding pillar of gate conductor material 141 with vertical side walls 142 is uncovered, as shown in FIG. 5K. The processing can now be continued in a standard CMOS technology as described, for example, by R. Colclaser, in "Microelectronics Processing and Device Design," chapter 10, pages 266–69 (John Wiley & Sons, 1988).

Figure 5L:
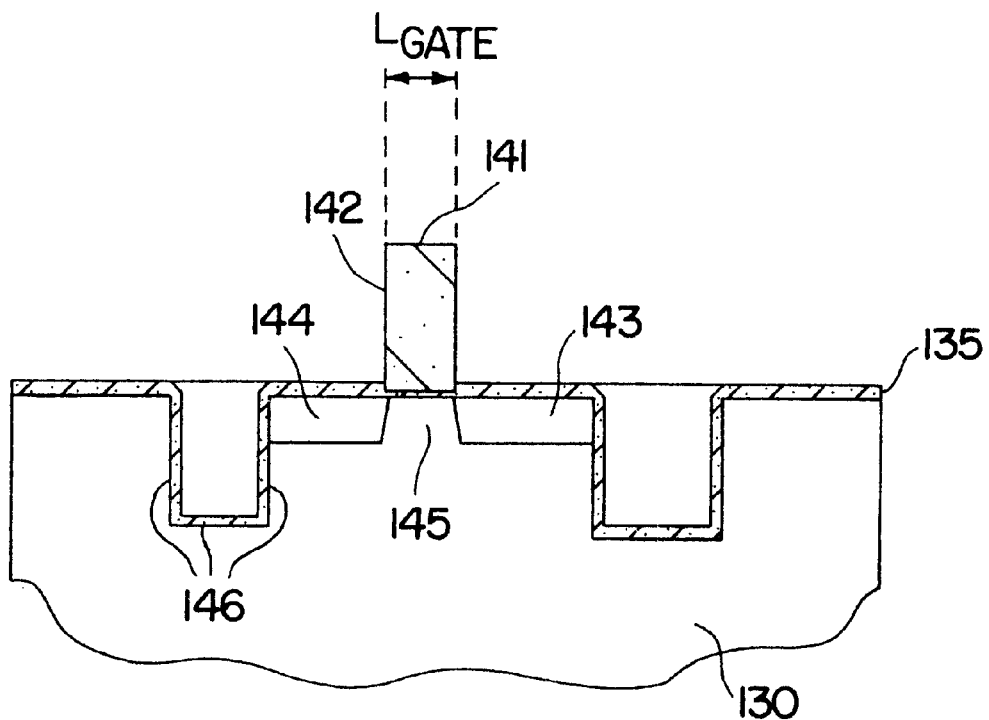

During subsequent steps, one may define the source region 143 and drain region 144—if not already done so earlier—by implantation of suited dopants, as shown in FIG. 5L. A channel 145 (situated underneath the pillar and between drain region 144 and source region 143) is thus defined. The channel length is about the same as the gate length because the source-channel and drain-channel interfaces are steep and abrupt (well defined), and the overlap is minimized, as discussed above.

Although illustrated and described above with reference to certain specific embodiments, the present invention is nevertheless not intended to be limited to the details shown. Rather, various modifications may be made in the details within the scope and range of equivalents of the claims and without departing from the invention.

What is claimed:

1. A composition for etching a trench in a silicon nitride layer of a multilayer structure in a damascene etch scheme, said composition consisting essentially of:

polymerizing agent selected from the group consisting of at least one of $CF_4$, $C_2F_6$, and $C_3F_8$ in an amount of about 0.1–25% by volume;

a hydrogen source selected from the group consisting of at least one of $CHF_3$, $CH_2F_2$, $CH_3F$, and $H_2$ in an amount of about 5–30% by volume;

a noble gas diluent selected from the group consisting of at least one of He, Ar, and Ne in an amount of about 0.1–50% by volume;

an oxidant comprising a carbon-containing oxidant component and an oxidant-noble gas component, wherein said carbon-containing component is selected from the group consisting of at least one of $CO_2$ and and CO and is added in an amount of about 1–25% by volume and said oxidant-noble gas component is $O_2$ in He and is added in an amount of about 0.1–20% by volume in a relative concentration of about 30% oxidant in said noble gas;

wherein said polymerizing agent, said hydrogen source, said noble gas diluent, and said oxidant are added in relative amounts to achieve a nitride selectivity to silicon oxide of at least about 4:1 and a nitride selectivity to photoresist of at least about 3:1.

2. The composition of claim 1, wherein:

said polymerizing agent is $C_2F_6$;

said hydrogen source is $CH_3F$;

said noble gas diluent is Ar; and said carbon-containing component is $CO_2$.

3. The composition of claim 1, wherein:

said polymerizing agent is added in an amount of about 3–8% by volume;

said hydrogen source is added in an amount of about 10–30% by volume;

said carbon-containing component is added in an amount of about 5–15% by volume;

said oxidant-noble gas component is added in an amount of about 5–15% by volume in a relative concentration of about 30% oxidant in said noble gas; and said noble gas diluent is added in an amount of about 10–50% by volume.

4. The composition of claim 1, wherein said etchant gas has a nitride selectivity to silicon oxide of at least about 5:1 and to photoresist of at least about 4:1.

* * * * *